United States Patent
Stengel

(10) Patent No.: US 8,780,566 B2
(45) Date of Patent: Jul. 15, 2014

(54) ENERGY STORAGE DEVICE WITH GAS-TIGHT CAPACITOR CHAMBER

(75) Inventor: Peter Stengel, Weilheim/Teck (DE)

(73) Assignee: Flextronics International Kft., Tab (HU)

(*) Notice: Subject to any disclaimer, the term of this patent is extended or adjusted under 35 U.S.C. 154(b) by 611 days.

(21) Appl. No.: 12/591,825

(22) Filed: Dec. 2, 2009

(65) Prior Publication Data

US 2010/0149757 A1    Jun. 17, 2010

(30) Foreign Application Priority Data

Dec. 4, 2008   (DE) .......................... 10 2008 062 657

(51) Int. Cl.
  *H05K 7/00*   (2006.01)
  *H05K 5/02*   (2006.01)
  *B60K 6/28*   (2007.10)
  *H01G 2/10*   (2006.01)

(52) U.S. Cl.
  USPC ................... 361/728; 174/17 GF; 174/17 VA

(58) Field of Classification Search
  CPC .......... B60L 11/005; B60K 6/28; H01G 2/04; H01G 15/00; H01G 17/00; H02J 15/00
  USPC ............................ 361/728; 174/17 GF, 17 VA
  See application file for complete search history.

(56) References Cited

U.S. PATENT DOCUMENTS

| | | | | |
|---|---|---|---|---|
| 1,580,873 A | * | 4/1926 | Weldon | 361/308.1 |
| 1,737,752 A | * | 12/1929 | William | 361/306.1 |
| 2,099,599 A | * | 11/1937 | De Lange | 361/521 |
| 2,367,725 A | * | 1/1945 | Lindh et al. | 156/308.8 |
| 2,379,189 A | * | 6/1945 | Rupp | 429/82 |
| 3,280,751 A | * | 10/1966 | Ekey | 417/423.7 |
| 3,648,337 A | * | 3/1972 | Greskamp et al. | 29/25.42 |
| 3,693,050 A | * | 9/1972 | Ettinger et al. | 361/715 |
| 3,972,380 A | * | 8/1976 | Hudson et al. | 180/65.25 |
| 4,050,770 A | * | 9/1977 | Rigo | 439/718 |
| 4,235,347 A | * | 11/1980 | Cothier et al. | 220/89.2 |
| 4,313,025 A | * | 1/1982 | Grube, Jr. | 174/50 |
| 5,091,823 A | * | 2/1992 | Kanbara et al. | 361/697 |

(Continued)

FOREIGN PATENT DOCUMENTS

DE   19510493   10/1995
DE   10131430   1/2003

(Continued)

OTHER PUBLICATIONS

English Translation of: Kuther, T. "DC/DC—Wander mit integrierten Supercaps Fur Hybridauto" Automotive Electronics Engineering Report, Sep. 2008, p. 16.

(Continued)

*Primary Examiner* — Jeremy C Norris
*Assistant Examiner* — Nathan Milakovich
(74) *Attorney, Agent, or Firm* — Haverstock & Owens LLP

(57) ABSTRACT

With the objective of improving an energy storage device comprising a transducer unit and a capacitor module which interacts with the transducer unit so it can be inserted as a physical device into a motor vehicle in particular, it is proposed to provide a housing to accommodate the capacitor cells of the capacitor module, for the housing to comprise a capacitor chamber accommodating the capacitor cells, and for the capacitor chamber to have a gas-tight seal.

19 Claims, 4 Drawing Sheets

(56) References Cited

U.S. PATENT DOCUMENTS

Figure 1:
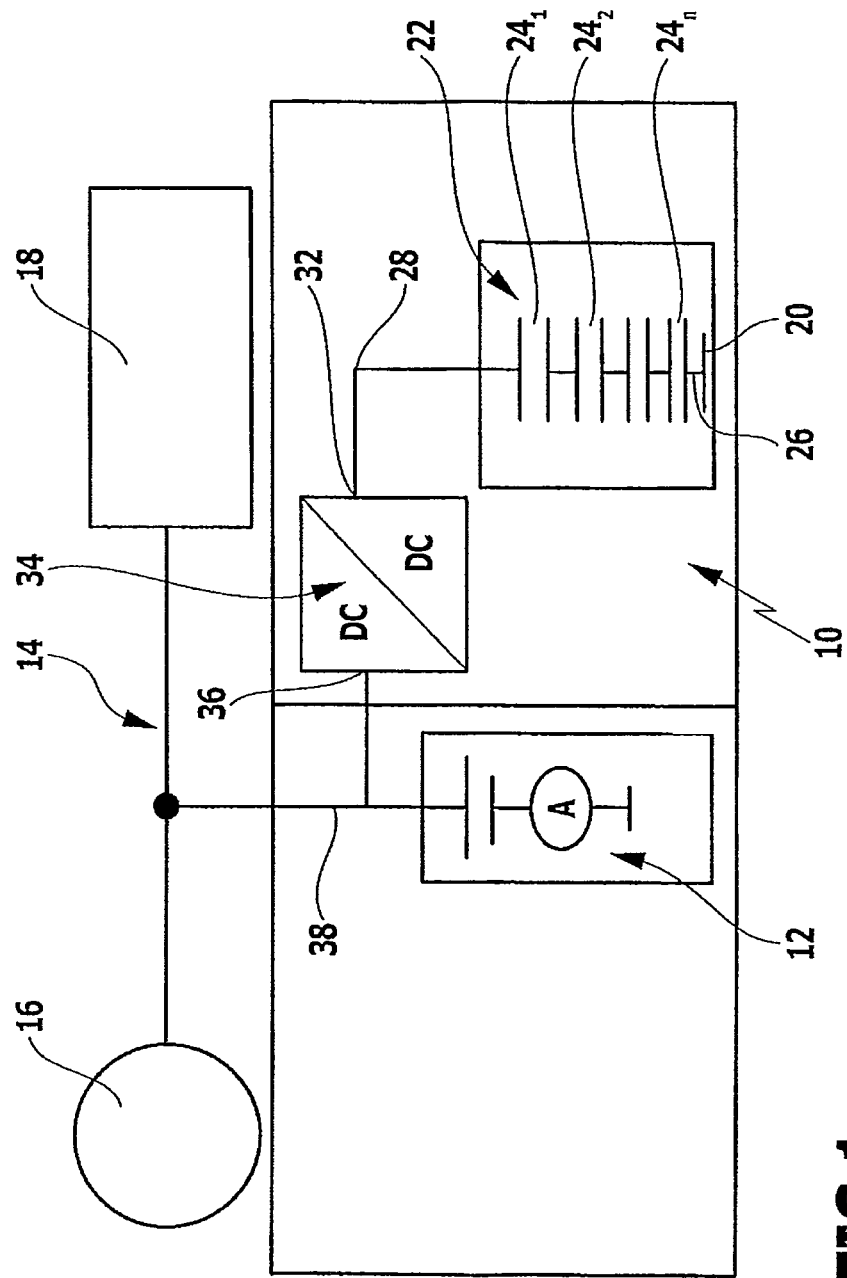

| | | | |
|---|---|---|---|
| 5,178,403 A * | 1/1993 | Kemner et al. | 280/423.1 |
| 5,251,721 A * | 10/1993 | Ortenheim | 180/298 |
| 5,678,646 A * | 10/1997 | Fliege | 180/65.1 |
| 5,880,951 A | 3/1999 | Inaba | |
| 5,942,728 A * | 8/1999 | Chen | 174/652 |
| 5,995,362 A * | 11/1999 | Morel et al. | 361/647 |
| 6,185,099 B1 * | 2/2001 | Le Gal | 361/699 |
| 6,323,623 B1 | 11/2001 | Someya et al. | |
| 6,419,037 B1 * | 7/2002 | Kramer et al. | 180/14.2 |
| 6,935,451 B2 * | 8/2005 | Bell et al. | 180/65.25 |
| 6,986,965 B2 * | 1/2006 | Jenson et al. | 429/162 |
| 7,016,177 B1 * | 3/2006 | Thrap | 361/502 |
| 7,482,816 B2 | 1/2009 | Odajima et al. | |
| 7,561,429 B2 * | 7/2009 | Yahata et al. | 361/715 |
| 7,619,878 B1 * | 11/2009 | Cook | 361/672 |
| 8,240,411 B2 * | 8/2012 | Nakatsu et al. | 180/65.21 |
| 8,258,792 B2 | 9/2012 | Vandensande | |
| 8,338,721 B2 * | 12/2012 | Bardia et al. | 174/560 |
| 8,462,531 B2 * | 6/2013 | Nishikimi et al. | 363/144 |
| 2001/0033473 A1 * | 10/2001 | Itahashi et al. | 361/301.3 |
| 2002/0142212 A1 | 10/2002 | Bean et al. | |
| 2005/0168911 A1 * | 8/2005 | Staib | 361/301.3 |
| 2006/0104006 A1 * | 5/2006 | Saito et al. | 361/301.3 |
| 2007/0007259 A1 * | 1/2007 | Mikhailov | 219/121.63 |
| 2007/0109715 A1 * | 5/2007 | Azuma et al. | 361/299.3 |
| 2007/0274027 A1 * | 11/2007 | Vetter et al. | 361/600 |
| 2008/0049476 A1 * | 2/2008 | Azuma et al. | 363/131 |
| 2008/0310079 A1 * | 12/2008 | Toia et al. | 361/503 |
| 2009/0145674 A1 * | 6/2009 | Lee et al. | 180/65.1 |
| 2009/0167315 A1 | 7/2009 | Lindsey | |
| 2009/0225496 A1 * | 9/2009 | Toia et al. | 361/503 |
| 2010/0060243 A1 * | 3/2010 | Niigaki et al. | 320/166 |
| 2010/0305794 A1 * | 12/2010 | Foster | 701/22 |
| 2011/0007480 A1 * | 1/2011 | Souda | 361/728 |
| 2012/0084033 A1 | 4/2012 | Liu et al. | |
| 2012/0127633 A1 * | 5/2012 | Mori et al. | 361/521 |
| 2013/0279114 A1 * | 10/2013 | Nishikimi et al. | 361/699 |

FOREIGN PATENT DOCUMENTS

| | | |
|---|---|---|
| DE | 10213570 A1 | 2/2003 |
| DE | 102005018339 A1 | 10/2006 |
| DE | 102007046578 | 4/2008 |
| DE | 102008040018 A1 * | 12/2009 |
| EP | 1422983 A2 | 5/2004 |
| EP | 1460660 A1 | 9/2004 |
| EP | 1820624 A2 | 8/2007 |
| WO | WO 2006111529 A1 | 10/2006 |
| WO | WO 2007/066372 | 6/2007 |
| WO | WO 2007080614 A1 * | 7/2007 |

OTHER PUBLICATIONS

English Translation of: Kuther, Y. "DC/DC—Wandler Mit Integrierten Supercaps fur Hybridautos," Elektronik Praxis, Sep. 16, 2008, http://www.elektronikpraxis.vogel.de/stromversorgung/articles/145077/ 1 page.

English Translation of: "Alcoa AFL: DC/DC—Wandler Mit Integrierten Supercaps," Hanser Automotive, Sep. 15, 2008, http://www.hanser-automotive.de/index.php?id=1515&tx_news%5Btt_news%5D=23701 , 2 pages.

* cited by examiner

ENERGY STORAGE DEVICE WITH GAS-TIGHT CAPACITOR CHAMBER

CROSS-REFERENCE TO RELATED APPLICATIONS

The present application claims priority from German Patent Application No. 102008062657.0, filed Dec. 4, 2008, the contents of which are herein incorporated by reference in their entirety.

The invention relates to an energy storage device comprising a transducer unit and a capacitor module which interacts with the transducer unit.

Such energy storage devices, particularly for motor vehicle on-board electrical systems, are known from the prior art, whereby their actual integration into the motor vehicle has not been perfected.

The invention is therefore based on the task of improving an energy storage device of the above-cited type such that it can be inserted as a physical device, particularly into a motor vehicle.

In accordance with the invention, this task is solved by an energy storage device of the above-cited type having a housing which accommodates the capacitor cells of the capacitor module, having the housing comprise a capacitor chamber accommodating the capacitor cells, and having the capacitor chamber exhibit a gas-tight seal.

The advantage of the inventive solution is seen to be in its preventing of negative impacts to the environment from chemical substances leaking from the capacitor cells such that when such an energy storage device is in use, adverse effects or endangerment to the environment in the vicinity of the energy storage device can be eliminated.

Providing a sorption material in the capacitor chamber for the chemical substances leaking from the capacitor cells is particularly advantageous. Such a sorption material allows the trapping, and thus bonding, of the chemical substances leaking from the capacitor cells either by absorption or adsorption.

Such sorption material can be of widely varying form.

One advantageous solution provides for an organic polymer-based sorption material.

It is thereby particularly preferable for the sorption material to be part of a filler material provided in the capacitor chamber.

Such a filler material can be distributed at will throughout the capacitor chamber around the capacitor cells.

One advantageous solution provides for the filler material to be in the form of a filler material padding.

Such a filler material padding is preferably arranged between the capacitor cells and a wall of the housing.

With respect to the design of the housing, no further details are given in conjunction with the previous clarification of the individual embodiments of the inventive energy storage device.

Thus, one advantageous solution provides for the housing to comprise a housing shell having a volume, which at least partly accommodates the capacitor chamber, extending inward from an opening in the housing shell.

The advantage of this solution can be seen in enabling a gas-tight housing to be easily produced.

Of even greater advantage is for the volume to wholly accommodate the capacitor chamber.

In order to have a gas-tight sealing of the capacitor chamber, it is preferably provided for the opening to be sealed by a cover so as to be gas-tight. Such a gas-tight sealing of the opening by a cover can be realized in any one of many different ways.

For example, it would be conceivable to provide an appropriate sealing material between the housing shell and the cover and brace the cover and the housing shell to one another.

Yet a particularly reliable connection between the cover and the housing shell, particularly in terms of gas-tightness, can be realized when the cover is connectable to the housing shell by means of an adhesive bond.

Such an adhesive bond can also be realized by e.g. cementing the cover and the housing shell together.

Particularly advantageous, especially in terms of the gas-tightness, however, is for the cover and the housing shell to be welded together.

Such welding of the cover and the housing shell can preferably be realized by having the housing shell or the cover exhibit a meltable bead area for producing the adhesive bond.

Such a bead area can be easily melted from the material of the housing shell or the cover so as to thereby produce the welded connection.

In order to in particular produce a non-contact welded connection, it is preferably provided for the cover to overlap the bead area by means of an edge strip and that the edge strip is of a material transparent to radiation for melting the bead area.

Thus, the welded connection between the cover and the housing shell can be easily produced, namely through the edge strip.

In order to prevent a deforming of the housing even when higher pressure develops in the capacitor chamber, it is preferably provided for the cover to be connected to the housing shell in a central area by means of at least one anchoring element. This thus allows a pressure-resistant connection to be produced between the cover and the housing shell.

It is preferably provided for the anchoring element to be a screw anchor, with which the connection between the cover and the housing shell can be easily produced.

It is thereby preferable for the screw anchor to be configured such that it projects through the cover in sealing same in order to also ensure a gas-tight sealing of the capacitor chamber in the area of the screw anchor.

In conjunction with the previous clarification of the inventive energy storage device, no further details are given on the arrangement of the transducer unit.

While the transducer unit could in principle be arranged in the capacitor chamber, this has the great disadvantage that chemical substances leaking from the capacitor cells could then compromise the operation of the transducer unit.

For this reason, one advantageous solution provides for arranging the transducer unit outside of the capacitor chamber.

Thus, only the capacitor cells of the capacitor module are arranged and interconnected in the capacitor chamber such that chemical substances leaking from the capacitor cells could only cause a limited extent of damage.

In principle, the transducer unit can be provided in a separate housing.

One advantageous solution does, however, provide for the transducer unit to be disposed in a circuit chamber in the same housing. This solution is particularly compact in terms of mounting into a motor vehicle.

In order to create a suitable connection between the capacitor module in the capacitor chamber and the transducer unit, it is preferably provided for the capacitor module to be connected to the transducer unit by means of high-current contacts so that these contacts will be capable of drawing high currents from the capacitor module, in particular to offset extreme loads in the power supply system.

In order to ensure the respective hermetic insulating of the capacitor cells in the capacitor chamber, it is preferably also provided for the high-current contacts to lead out of the capacitor chamber in gas-tight manner.

It is in particular thereby provided for the high-current contacts to lead in gas-tight manner through a wall of the part of the housing enclosing the capacitor chamber.

Particularly advantageous is for the high-current contacts to lead through a wall separating the circuit chamber from the capacitor chamber.

In order to be able to easily create a compact connection between the capacitor cells in the capacitor chamber and the transducer unit, it is preferably provided to connect a contact chamber to the capacitor chamber in which a connection can be made to the high-current contacts penetrating a wall of said contact chamber in gas-tight manner.

In particular hereto, the wall penetrated by the high-current contacts is at least part of a partition between the contact chamber and a circuit chamber of the housing which is hermetically separated from the contact chamber and the capacitor chamber.

The circuit chamber is preferably arranged in the same housing which also accommodates the capacitor chamber, although completely separate from said capacitor chamber and the contact chamber.

Further features and advantages of the invention are the object of the following description as well as the graphical representations of an embodiment.

Figure 2:
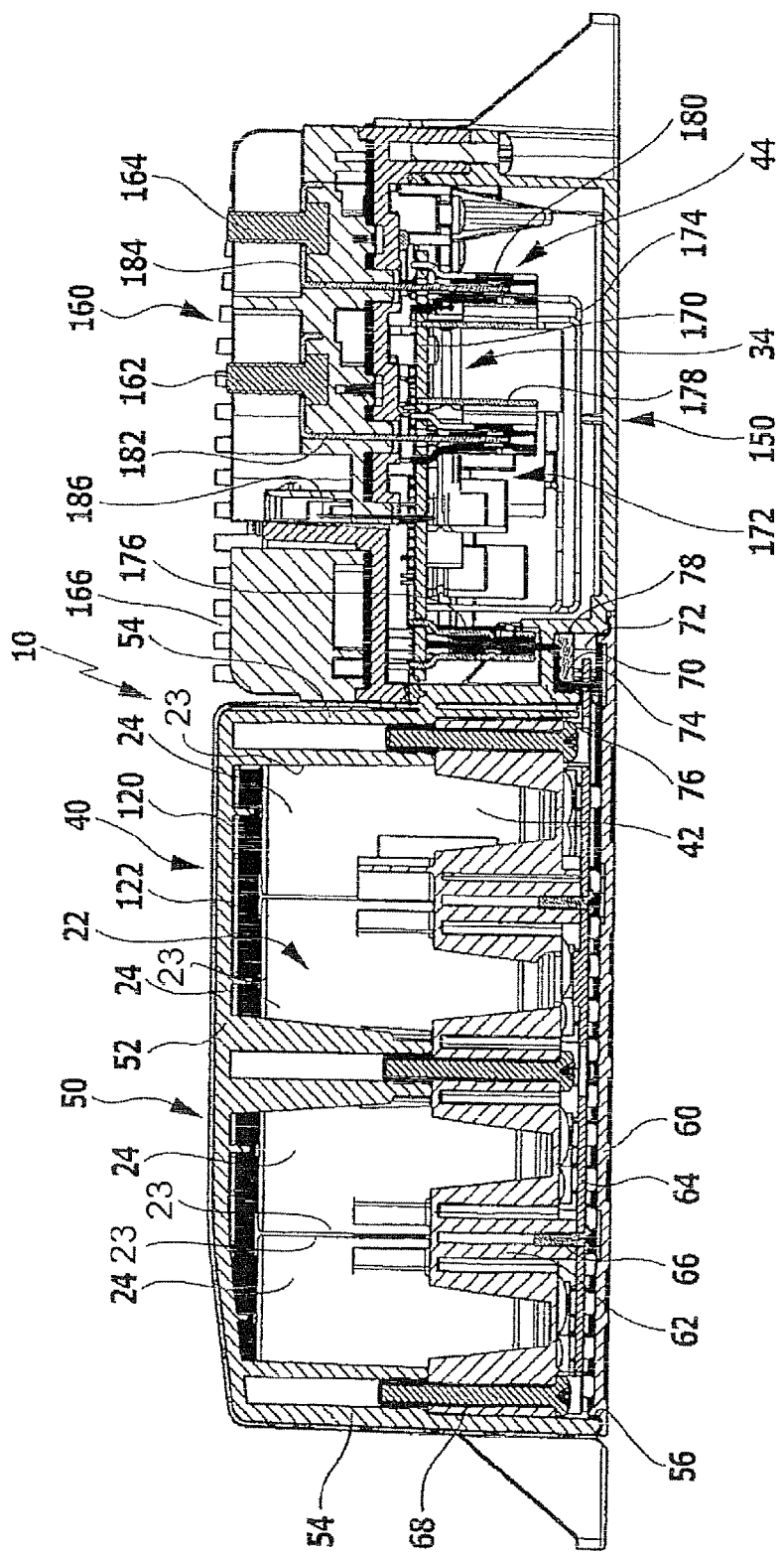
Figure 3:
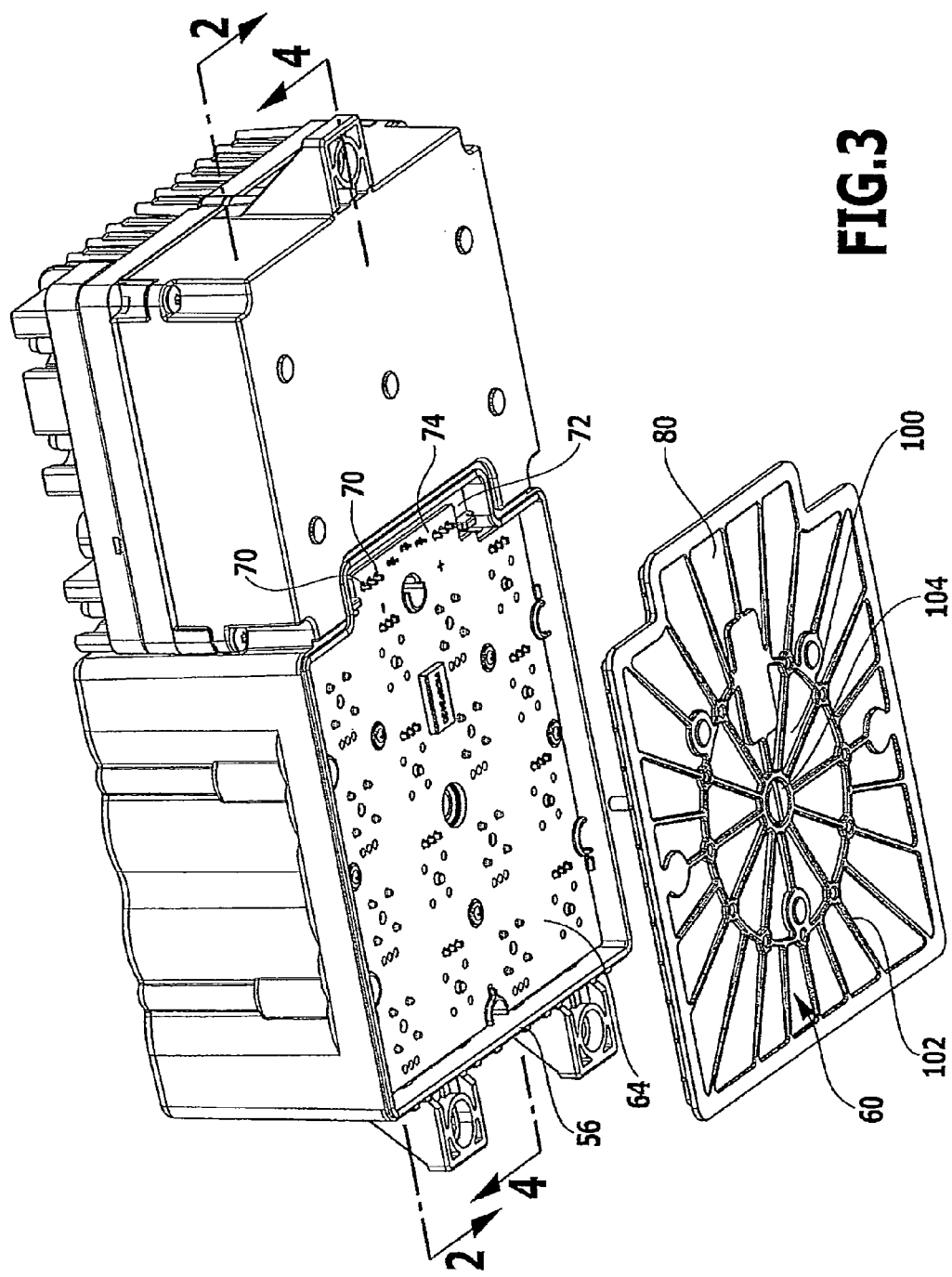
Figure 4:
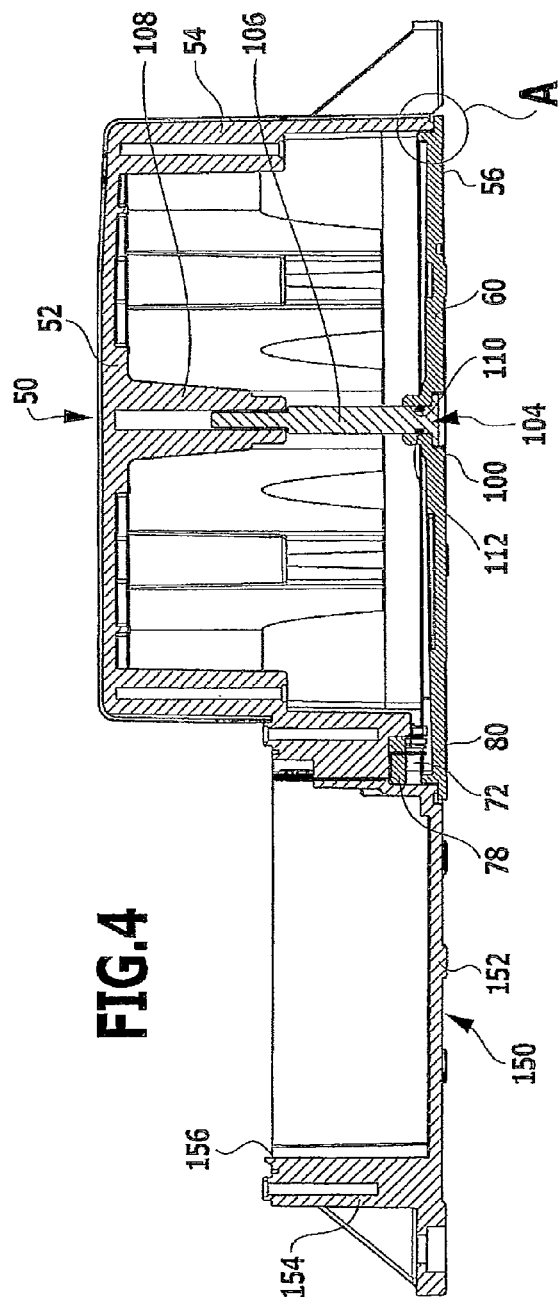

The drawings show:

FIG. 1 a schematic diagram of an inventive energy storage device;

FIG. 2 a longitudinal section of an assembled housing along line 2-2 from FIG. 3;

FIG. 3 an exploded view of an inventive energy storage device showing a housing and a detached bottom cover;

FIG. 4 a section along the line 4-4 from FIG. 3; and

Figure 5:
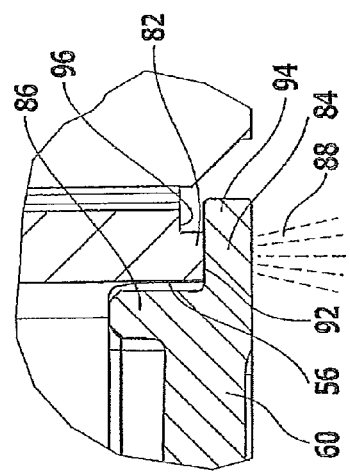

FIG. 5 an enlarged depiction of area A from FIG. 4.

One embodiment of an inventive energy storage device 10 is for example arranged, supplementally to a battery 12, in a power supply line 14 of a motor vehicle which for example also comprises, additionally to the battery 12 and the energy storage device 10, a generator 16 as well as a plurality of consumers 18, all situated between the power supply line 14 and the ground 20.

The energy storage device 10 comprises a capacitor module 22 which has a plurality of capacitor cells 24 connected in series.

The capacitor module 22 is connected to the ground 20 for example by a first connection 26 and to a DC/DC transducer unit 34 by a second connection 28 having an output 32, its input 36 connected to a supply line 38 of the power supply line 14 which can be supplied with a voltage of between about 8 and about 14 V, for example.

As depicted in FIG. 2, the energy storage device 10 is arranged in a housing 40 comprising a capacitor chamber 42 to accommodate all the capacitor cells 24 of the capacitor module 22 on the one hand and, on the other, a circuit chamber 44 in which the entire electronic circuitry of the transducer unit 34 as well as any further circuitry of additional units there may be are arranged. As further depicted in FIG. 2, each of the capacitor cells 24 comprise a housing 23 that houses the individual cell 24.

The capacitor chamber 42 and the circuit chamber 44 are thereby hermetically separated from one another in order to create optimum conditions for the capacitor cells 24 in the capacitor chamber 42 which can be selected independently of the conditions applicable to the electrical circuitry in the circuit chamber 44.

To form the capacitor chamber 42, the housing 40 exhibits a housing shell 50 comprising a cover 52 and side walls 54 which extend to an opening 56 in the housing shell 50, whereby the opening 56 of the housing shell 50 can be closed by a bottom cover 60 situated opposite said cover 52.

The individual capacitor cells 24 are fixed relative one another in the capacitor chamber 42 on the one hand by a capacitor retainer 62 and on the other by a capacitor circuit board 64, whereby the capacitor retainer 62 and the capacitor circuit board 64 are fixed relative to one another by retaining elements 66, for example screws, and, on the other hand, the capacitor retainer 62 is fixed in the housing shell 50 by retaining elements 68, for example also screws.

The capacitor cells 24 are secured in the housing shell 50 by means of the capacitor retainer 62 and the capacitor circuit board 64 such that the capacitor circuit board 64 faces the bottom cover 60 and runs contiguous to same.

The capacitor circuit board 64 thereby comprises the electrical conductors for connecting the capacitor cells 24 and creates a connection to high-current contacts 70 which are arranged in a contact chamber 72 adjacent and connected to the capacitor chamber 42 likewise provided in the housing shell 50 into which the capacitor circuit board 64 extends by means of a contact area 74 such that conductors leading into the contact area 74 can be connected to the high-current contacts 70, for example by soldering.

The high-current contacts 70 penetrate the wall 76 separating the contact chamber 72 from the circuit chamber 44, whereby they are preferably injected into same, and the high-current contacts 70 are additionally embedded in a sealing compound 78 covering the wall 76 so that the high-current contacts 70 can run through the wall 76 in gas-tight manner.

As FIG. 3 depicts, the bottom cover 60 extends not only over the capacitor chamber 42 to close same, but also over the contact chamber 72 by means of a cover lip 80 so as to seal both together, wherein the opening 56 of the housing shell 50 also extends around the contact chamber 72.

As depicted in detail in FIGS. 4 and 5, a bead area 82 runs along and around the opening 56 and both the bottom cover 60 as well as the cover lip 80 overlap the bead area 82 by means of an edge strip 84 which projects laterally outward over a guide web 86 engaging in the opening 56 which, when inserted, guides the cover 60 as well as the cover lip 80 relative to the opening 56 toward a surface extension of the cover 60 with the cover lip 80 relative to the housing shell 50.

Preferably, either the cover 60 with the cover lip 80 or at least the edge strip 84 is designed transparent to incident high-energy radiation 88, for example laser radiation, such that the bead area 82 can melt upon the high-energy radiation 88 passing through the edge strip 84 in order to thus create a material connection between the bead area 82 and the edge strip 84.

The edge strip 84 preferably extends further over a material melting zone 92 by means of an outer edge 94 and the bead area 82 rises over a circumferential supporting edge 96 on a side of the bead area 82 opposite the opening 56 such that upon the melting of the bead area 82 in the material melting zone 92, the cover 60 with the cover lip 80 can be pressed until the outer edge 94 bears on the supporting edge 96.

The material connection resulting in the material melting zone 92 between the bottom cover 60 and the cover lip 80 produces a stable connection between same and the housing shell 50, although not able to prevent a bulging of a center area 100 of the cover 60 upon excess pressure developing in the capacitor chamber 42 and the contact chamber 72.

For this reason, the cover 60 is additionally provided with reinforcing ribs 102 running from the edge strip 84 to the center area 100, in particular, as shown in FIG. 3, to an anchoring element 104, and which extend for example radially over the expanse of the cover 60 to said anchoring element 104.

The anchoring element 104 is, as FIG. 4 shows, composed of a screw anchor 106 which can be screwed into a receiver 108 of the housing shell 50, wherein the receiver 108 is formed for example on the upper cover 52 of the housing shell 50.

The screw anchor 106 enters into an opening 110 provided in the center area 100 of cover 60 and is sealed relative the opening 110 by a seal 112 so as to thus ensure that the capacitor chamber 42 will also have a gas-tight seal against its surroundings in the area of the screw anchor 106.

When the capacitor cells 24 age inside the gas-tight sealed capacitor chamber 42, they can exhibit volume expansion as well as leaking chemical substances. For this reason, an intermediate space 120 is provided between the cover 52 and the sides of the capacitor cells 24 facing same in which elastic filler material 122 is disposed and thus volume expansions of the capacitor cells 24 can be compensated. The filler material 122 is however moreover provided with a sorption material for the chemical substances leaking from the capacitor cells 24.

When electrochemical double-layer capacitors are used as the capacitor cells 24, the aging effect in the capacitor cells 24 yields an internal increase in pressure and an outer housing 23 for each of the capacitor cells is designed so as to rupture when a predefined pressure level is exceeded. Acetonitrile thereupon leaks from the capacitor cells 24 and this acetonitrile can be absorbed by the filler material 122 given its appropriate configuration.

As the sorption material 124 to sorb the acetonitrile leaking from the capacitor cells 24 via sorption; i.e. absorption and adsorption, the filler material 122 is for example provided with organic polymers, wherein the material is selected not only in terms of its good absorption and adsorption properties but also in terms of the most advantageous desorption properties possible in order to keep the releasing of already absorbed or adsorbed acetonitrile as low as possible.

Advantageous with respect to a simple assembly of the energy storage device is for the filler material 122 provided with the sorption material 124 to be in the form of a filler material padding 126 arranged between the cover 52 and the capacitor cells 24.

The circuit chamber 44 is formed by a second housing shell 150 formed integrally on the first housing shell 50 which, as shown in FIGS. 2, 3 and 4, comprises a bottom cover 152 from which side walls 154 rise up to an opening 156 which can be closed by a cover unit 160, wherein the cover unit 160 comprises high-current connections 162 and 164 on the one hand and, on the other, cooling ribs 166, wherein the cooling ribs 166 serve to cool the power components of the transducer unit 34.

For its part, the transducer unit 34 comprises a transducer circuit 172 arranged on a circuit board 170 accommodating the power components to be cooled by the cooling ribs 166.

The high-current paths of the converter circuit 172 are moreover realized by means of pressed screens 174 which carry the high currents.

To connect the circuit board 170 to the high-current contacts 70, the circuit board 170 is provided with plug contacts 176 which can plug into the parts of the high-current contacts 70 extending into the circuit chamber 44 and, on the other hand, the circuit board 170 is provided with further plug contacts 178, 180 into which contact bridges 182, 184 leading to the high-current connections 162 and 164 can be plugged, whereby the contact bridges 182 and 184 are anchored in the cover unit 160, preferably inset into same.

Control contacts 186 are furthermore provided in the cover unit 160, which are likewise connected to the circuit board 170 so as to be able to feed control signals from external control devices to the transducer circuit 172.

The invention claimed is:

1. An energy storage device comprising:
   a transducer unit;
   one or more capacitor cells each comprising a cell housing, wherein the one or more capacitor cells are operably coupled with the transducer unit; and
   a chamber housing having a structure that forms a capacitor chamber and a circuit chamber such that the capacitor chamber and the circuit chamber are integrated into the structure of the chamber housing, wherein the capacitor chamber accommodates the capacitor cells such that the capacitor cells are coupled within the capacitor chamber and the circuit chamber accommodates the transducer unit such that the transducer unit is coupled within the circuit chamber, and further wherein the capacitor chamber has a gas-tight seal and the circuit chamber is completely separate from and disposed outside of the capacitor chamber.

2. The energy storage device according to claim 1, characterized in that a sorption material is arranged in the capacitor chamber for sorption of chemical substances leaking from the capacitor cells.

3. The energy storage device according to claim 2, characterized in that the sorption material is made from an organic polymer.

4. The energy storage device according to claim 2, characterized in that the sorption material is part of a filler material provided in the capacitor chamber.

5. The energy storage device according to claim 4, characterized in that the sorption material is integrated into a filler material padding.

6. The energy storage device according to claim 1, characterized in that the chamber housing exhibits a housing shell having a volume, which at least partly accommodates the capacitor chamber, extending inward from an opening in said housing shell.

7. The energy storage device according to claim 6, characterized in that the volume wholly accommodates the capacitor chamber.

8. The energy storage device according to claim 6, characterized in that the opening can be sealed by a cover so as to be gas-tight.

9. The energy storage device according to claim 8, characterized in that the cover is connected to the housing shell by means of an adhesive bond.

10. The energy storage device according to claim 9, characterized in that the cover and the housing shell are welded together.

11. The energy storage device according to claim 9, characterized in that the housing shell or the cover exhibits a meltable bead area for producing the adhesive bond.

12. The energy storage device according to claim 11, characterized in that the cover overlaps the bead area by means of an edge strip and that the edge strip is of a material transparent to radiation for melting the bead area.

13. The energy storage device according to claim 8, further comprising at least one anchoring element positioned in the center of the cover and detachably coupling the center of the cover to the center of the housing shell.

14. The energy storage device according to claim 13, characterized in that the anchoring element is a screw anchor.

15. The energy storage device according to claim 14, characterized in that the screw anchor projects through the cover to seal same.

16. The energy storage device according to claim 1, characterized in that the one or more capacitor cells are connected to the transducer unit by means of current contacts.

17. The energy storage device according to claim 16, characterized in that the current contacts lead out of the capacitor chamber in gas-tight manner.

18. An energy storage device comprising:
a transducer unit;
one or more capacitor cells each comprising a cell housing, wherein the one or more capacitor cells are operably coupled with the transducer unit;
a chamber housing comprising: a capacitor chamber accommodating the capacitor cells such that the capacitor cells are coupled within the capacitor chamber, wherein the capacitor chamber has a gas-tight seal and one or more capacitor retainers that hug the perimeter of each of the capacitor cells such that the capacitor cells are fixed relative to each other; and a circuit chamber accommodating the transducer unit such that the transducer unit is coupled within the circuit chamber, wherein the circuit chamber is completely separate from and disposed outside of the capacitor chamber; and a flat bottom cover that seals the capacitor chamber of the chamber housing, wherein the flat bottom cover comprises one or more support ribs that extend radially from the perimeter of the flat bottom cover to a central area of the flat bottom cover.

19. The energy storing device according to claim 18, wherein each capacitor cell is an electrochemical double-layer capacitor cell.

* * * * *